(12) United States Patent
Pope et al.

(10) Patent No.: US 7,923,830 B2
(45) Date of Patent: Apr. 12, 2011

(54) PACKAGE-ON-PACKAGE SECURE MODULE HAVING ANTI-TAMPER MESH IN THE SUBSTRATE OF THE UPPER PACKAGE

(75) Inventors: Steven M. Pope, Los Gatos, CA (US); Ruben C. Zeta, Milpitas, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 614 days.

(21) Appl. No.: 11/786,871

(22) Filed: Apr. 13, 2007

(65) Prior Publication Data
US 2008/0251905 A1 Oct. 16, 2008

(51) Int. Cl.
*H01L 23/02* (2006.01)
(52) U.S. Cl. ....... 257/679; 257/698; 713/178; 174/52.4; 174/261
(58) Field of Classification Search .......... 174/52.4, 174/255, 261; 257/737, E23.021, E23.069; 345/156; 361/813; 713/194, 178; 235/492; 365/185.04; 219/549
See application file for complete search history.

(56) References Cited

U.S. PATENT DOCUMENTS

| | | | | |
|---|---|---|---|---|
| 5,117,457 A | * | 5/1992 | Comerford et al. | 713/194 |
| 5,389,738 A | * | 2/1995 | Piosenka et al. | 174/528 |
| 5,783,870 A | | 7/1998 | Mostafazadeh et al. | 257/791 |
| 5,861,662 A | | 1/1999 | Candelore | 257/679 |
| 5,956,576 A | | 9/1999 | Toy et al. | 438/125 |
| 6,016,256 A | * | 1/2000 | Crane et al. | 361/813 |
| 6,452,283 B2 | * | 9/2002 | Smola et al. | 257/784 |
| 6,496,119 B1 | * | 12/2002 | Otterstedt et al. | 340/653 |
| 6,646,565 B1 | | 11/2003 | Fu et al. | 340/687 |
| 6,753,600 B1 | * | 6/2004 | Ho | 257/698 |
| 7,054,162 B2 | | 5/2006 | Benson et al. | 361/760 |
| 7,065,656 B2 | | 6/2006 | Schwenck et al. | 713/194 |
| 7,126,829 B1 | | 10/2006 | Yen | 361/803 |
| 2001/0033012 A1 | | 10/2001 | Kommerling et al. | 257/679 |
| 2002/0127771 A1 | | 9/2002 | Akram et al. | 438/107 |
| 2003/0008432 A1 | | 1/2003 | Kux et al. | 438/106 |
| 2003/0052399 A1 | | 3/2003 | Shibata | 257/686 |
| 2003/0122779 A1 | * | 7/2003 | Martin et al. | 345/156 |
| 2004/0188135 A1 | * | 9/2004 | Brodsky et al. | 174/255 |
| 2005/0173414 A1 | * | 8/2005 | Ishii et al. | 219/549 |
| 2006/0086534 A1 | * | 4/2006 | Oggioni et al. | 174/261 |
| 2006/0087883 A1 | * | 4/2006 | Ozguz et al. | 365/185.04 |
| 2006/0170091 A1 | | 8/2006 | Karnezos | 257/686 |
| 2006/0231633 A1 | * | 10/2006 | Farooq et al. | 235/492 |
| 2006/0231938 A1 | | 10/2006 | Mangrum | 257/686 |
| 2006/0231950 A1 | * | 10/2006 | Yoon | 257/737 |
| 2007/0018334 A1 | | 1/2007 | Peytavy et al. | 257/778 |
| 2007/0038865 A1 | * | 2/2007 | Oggioni et al. | 713/178 |

OTHER PUBLICATIONS

International Search Report and Written Opinion of International Searching Authority for PCT/US07/17755 dated Mar. 11, 2008 (12 pages).
Supplementary European Search Report for EP07836686 dated Jun. 15, 2009 (3 pages).

* cited by examiner

*Primary Examiner* — Matthew E Warren
*Assistant Examiner* — Fang-Xing Jiang
(74) *Attorney, Agent, or Firm* — North Weber & Baugh LLP

(57) ABSTRACT

A package-on-package (POP) secure module includes a first ball grid array (BGA) package and a second BGA package. The first BGA includes an array of bond balls that is disposed on a side of a substrate member, and an array of lands that is disposed on the opposite side of the substrate member. Bond balls of the second BGA are fixed to the lands of the first BGA such that the second BGA is piggy-back mounted to the first BGA. Embedded in the substrate member of the second BGA is an anti-tamper security mesh. An integrated circuit in the first BGA is coupled to, drives and monitors the security mesh. When the module is disposed on a printed circuit board within a point of sale (POS) terminal, the integrated circuit is coupled to, also drives and monitors a second security mesh embedded in the printed circuit board underneath the module.

17 Claims, 8 Drawing Sheets

POINT OF SALE TERMINAL

PACKAGE-ON-PACKAGE (POP)
SECURE MODULE

ANTI-TAMPER MESH IN UPPER BGA SUBSTRATE
PREVENTS INTRUSION FROM ABOVE

BOTTOM VIEW WITH ENCAPSULATION REMOVED

ANTI-TAMPER PICKET FENCE PREVENTS
INTRUSION FROM THE SIDES

ANTI-TAMPER MESH IN PCB PREVENTS INTRUSION FROM BELOW

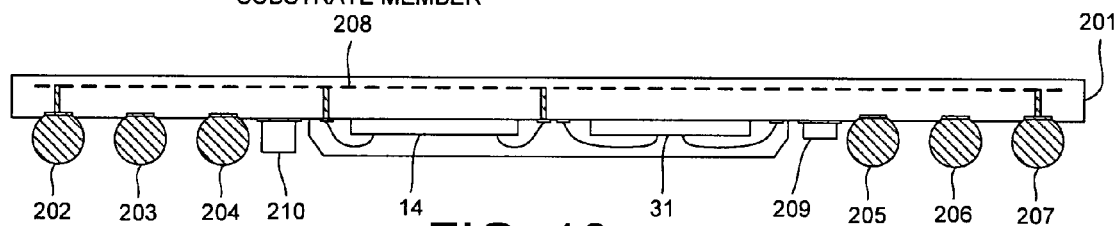
FIG. 10
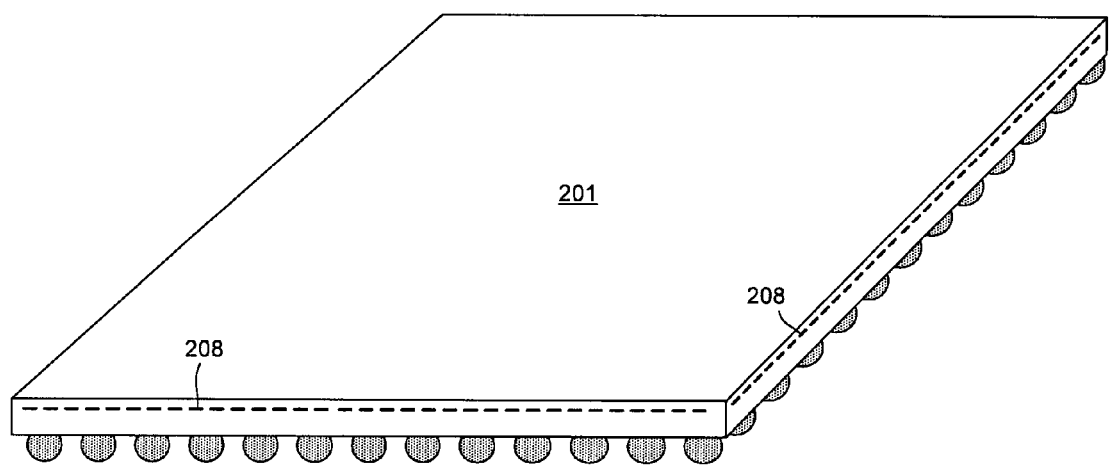
FIG. 11

PACKAGE-ON-PACKAGE SECURE MODULE HAVING ANTI-TAMPER MESH IN THE SUBSTRATE OF THE UPPER PACKAGE

TECHNICAL FIELD

The described embodiments relate to securing electronic components and data from unauthorized access, and more particularly to securing electronic components in Point Of Sale (POS) terminals.

BACKGROUND INFORMATION

Purchases are often made using an electronic device called a Point Of Sale (POS) terminal. The POS terminal is typically coupled to a financial institution via an electronic communication link. A customer in a store may, for example, present a debit card, credit card, cash card or smart card to the store's cashier for payment. Consider an example of a transaction with a smart card. The customer presents the smart card to the cashier of the store. The cashier pushes the smart card into a smart card reader port on the POS terminal and the POS terminal reads an account number stored in the smart card. The customer then, for identification purposes, typically enters a Personal Identification Number (PIN) into a keypad device coupled to the POS terminal. The customer may also enter other identification information. The customer may, for example, provide a signature on a signature capture device coupled to the POS terminal.

The POS terminal then uses an encryption key stored in the POS terminal to encrypt the account number (from the smart card), the identification number (for example, the PIN number), and other information about the transaction such as the amount of the transaction and the date of the transaction. The encrypted information is sent from the POS terminal to the financial institution via a modem or other electronic communication link.

The financial institution receives the encrypted information and uses an encryption key to decrypt the information and recover the account number, identification information, and information about the transaction. In the case where the transaction is a debit transaction, the bank account of the customer is debited. A confirmation of the transaction is then encrypted using the encryption key and the encrypted confirmation is communicated from the financial institution back to the POS terminal. The POS terminal uses the encryption key stored in the point of sale terminal to decrypt the confirmation. Typically, the confirmation is printed out as part of a transaction receipt and a copy of the receipt is provided to the customer.

Accordingly, it is seen that sensitive financial and identification information is entered into and passes through the POS terminal. Encryption keys are typically stored in the POS terminal so that the POS terminal can communicate with the financial institution in a secure manner. Moreover, as the POS terminal is used, information about customers is stored in and/or passes through the POS terminal. Such information may include account numbers and their associated PIN numbers.

Various methods are employed to prevent such sensitive information from falling into the hands of thieves. In one example, the integrated circuits within the POS terminal that contain the sensitive information are surrounded, encased or covered with a fine wire mesh. Certain of the conductors of the mesh are coupled to a first terminal of the integrated circuit, whereas others of the conductors of the mesh are coupled to a second terminal of the integrated. The integrated circuit monitors the first and second terminals. If a thief were to attempt to probe through the mesh to get access to the integrated circuit, then certain of the conductors would likely be cut or pushed together. This condition would be detected by the integrated circuit as a tamper condition. If the integrated circuit were to detect such a tamper condition, then the integrated circuit would quickly erase the sensitive information (for example, encryption keys) so that if the thief were to then gain access to the integrated circuit, the sensitive information would have already been erased.

In one exemplary prior art POS terminal, the POS terminal includes a processor integrated circuit, a Static Random Access Memory (SRAM) integrated circuit, and a non-volatile memory integrated circuit. The processor and SRAM integrated circuits are covered with an anti-tamper mesh. An application program is stored in the nonvolatile memory. Upon power up, an operating system executing on the processor transfers the application program from the nonvolatile memory to the SRAM. Encryption keys are stored in Read Only Memory (ROM) on the processor integrated circuit. If the processor validates the application program to be a valid image, then the processor executes the application program out of SRAM. Subsequent operation of the POS terminal may use the encryption keys and may temporarily place the encryption keys in the SRAM. Accordingly, upon detection of a tamper condition, the SRAM as well as other volatile storage locations in the processor are quickly erased before a thief can gain access to the sensitive information stored in volatile memory in the processor and SRAM integrated circuits.

Numerous techniques exist in the prior art for providing a security mesh. For example, U.S. Pat. No. 6,646,565 describes a POS terminal having a secure case. The case includes what is called a security fence module that is sandwiched between two printed circuit boards. Each of the printed circuit boards includes a serpentine trace layer so that the assembly of the two printed circuit boards and the security fence module together enclose a secured volume.

U.S. Pat. No. 7,054,162 describes a security module that includes a substrate and a cover. The substrate and cover include inter-digitated serpentine serial conductive paths. When the cover and substrate are abutted together through ball grid array interconnects, the serpentine conductive paths essentially surround the volume enclosed between the cover and substrate. The grid array of connections at the periphery of abutting cover and substrate have a staggered row or picket fence configuration that prevents intrusion from the side.

U.S. Patent Application Publication No. 2007/0038865 describes a cap that is adapted to mount to a printed circuit board such that tamper-proof tracks in the cover are linked with tamper-proof tracks in the printed circuit board. The tracks in the cap and printed circuit board together form a tamper-proof security shield that protects a chamber.

U.S. Pat. No. 7,065,656 describes a method of protecting a printed circuit board from tampering by applying flexible plastic polymer layers having embedded trip wires.

U.S. Patent Application Publication No. 2006/0231633 describes a tamper resistant ceramic multi-chip module (MCM) that includes a ceramic chip carrier and a ceramic cap. Each of the chip carrier and the cap includes what are called security meander lines. Solder balls or solder fillets couple the cap to the chip carrier so as to enclose an internal cavity.

U.S. Patent Application Publication No. 2006/0087883 describes an anti-tamper module involving a connection layer that connects the module to an external system using a ball-grid array of solder balls. In one example, a wire mesh encased in epoxy is a protective layer that encases the module.

U.S. Pat. No. 5,861,662 describes an anti-tamper shield for an integrated circuit. In one example, the conductors of the shield have a grid pattern and are made of conductive epoxy.

U.S. Patent Application Publication No. 2007/0018334 describes a cavity-down integrated circuit package that has an embedded security shield. A printed circuit board also has an embedded security shield. When the package is connected to the printed circuit board with ball connectors, the shield in the package and the shield in the printed circuit board together form a security envelope that shields the integrated circuit of the package from tampering.

Unfortunately, providing a security mesh for a point or sale terminal circuit is typically undesirably expensive and/or is inadequate. An alternative solution is sought.

SUMMARY

A Package-On-Package (POP) secure module sees use in a Point Of Sale (POS) terminal. The POP secure module includes a first ball grid array (BGA) package portion and a second BGA package portion. The first BGA package portion includes a substrate member, an array of bond balls that is disposed on a side of a substrate member, and an array of lands that is disposed on the opposite side of the substrate member. Bond balls of the second BGA package portion are fixed to the lands of the first BGA package portion such that the second BGA package portion is piggy-back mounted to the first BGA package portion. Embedded in the substrate member of the second BGA package portion is a first anti-tamper security mesh. The first anti-tamper security mesh extends laterally in the plane of the substrate member, and also extends vertically in a curtain-like fashion to form a picket fence security mesh structure around the side edges of the module.

An integrated circuit in the first BGA package portion is coupled to, drives and monitors the first anti-tamper security mesh. When the module is disposed on a Printed Circuit Board (PCB) within a POS terminal, the integrated circuit is coupled to, drives and monitors a second anti-tamper security mesh. The second anti-tamper security mesh is realized in a metal trace layer within the PCB upon which the POP secure module is mounted. The second anti-tamper security mesh extends underneath the POP secure module. Accordingly, the planar portion of the first mesh in the substrate member of the second BGA package portion protects against intrusion from above, the picket fence peripheral extension of the first mesh protects against intrusion from the sides, and the second mesh in the underlying PCB protects against intrusion from below.

In one example, the integrated circuit in the first BGA package portion is a specialized integrated circuit that includes tamper detection logic and special circuitry that is specially adapted for use in a point of sale terminal. The integrated circuit is produced and sold by an entity (for example, a first semiconductor company) that does not make and sell memory devices for general use. The second BGA package portion contains a general purpose memory integrated circuit that is produced and sold by an entity (for example, a second semiconductor company) that does sell discrete memory devices for general use. This memory integrated circuit is a type that sees primary use in applications other than in point of sale terminals. Compared to the specialized integrated circuit, the memory integrated circuit is mass produced in larger volumes. The memory needed in the secure module is provided by including the discrete memory integrated circuit rather than by providing additional memory on the specialized integrated circuit and making the specialized integrated circuit larger in order to take advantage of the relatively low cost of providing the memory in the form of an integrated circuit that is produced in higher volumes. Both the specialized integrated circuit and the mass produced memory integrated circuit are enclosed in a secure volume that is shielded by the first and second anti-tamper security meshes. If a tamper condition is detected, then the contents of the discrete memory integrated circuit are quickly erased as prompted by tamper detection logic in the specialized integrated circuit.

The secure module involving a separate SRAM integrated circuit in a POP module allows different versions of the module to be realized without having to modify either the design of the specialized integrated circuit or the substrate member of the first BGA package portion. An added benefit of the POP package is that a different sized memory or different memory type can be provided in different version of the module without changing the first BGA package portion or its specialized integrated circuit.

In a second novel aspect, the specialized integrated circuit and the memory integrated circuit are disposed, side by side, in a single cavity-down ball grid array (BGA) package. The BGA package includes a substrate member. An anti-tamper security mesh is embedded in the substrate member, and the specialized integrated circuit is coupled to, drives and monitors the anti-tamper security mesh. When the BGA package is disposed on a PCB within a point of sale (POS) terminal, the specialized integrated circuit also is coupled to, drives and monitors a second anti-tamper security mesh. The second anti-tamper security mesh is realized in a metal trace layer within the PCB upon which the BGA package is mounted. The second anti-tamper security mesh extends underneath the BGA package.

Further details and embodiments are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 10-12 are diagrams of a single cavity-down ball grid array (BGA) package whose substrate member includes an anti-tamper security mesh in accordance with a second novel aspect.

DETAILED DESCRIPTION

Figure 1:
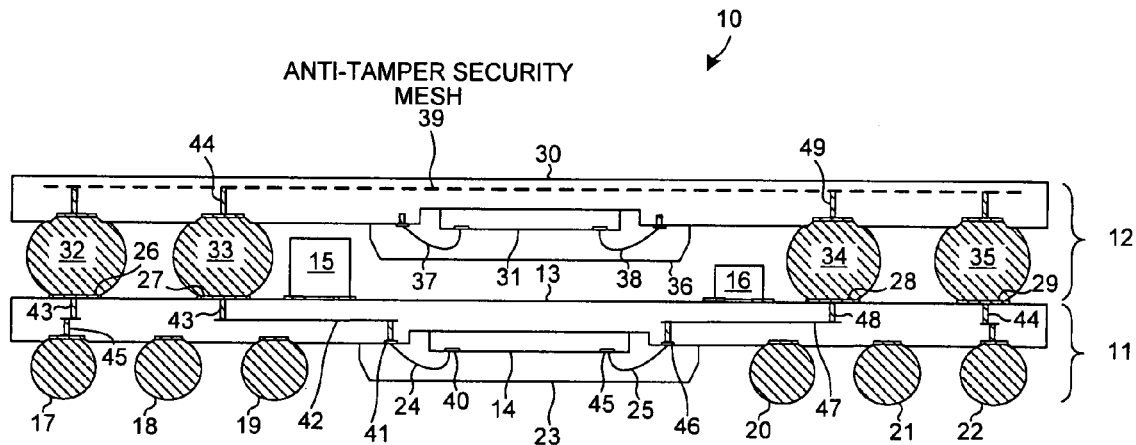
FIG. 1 is a simplified cross-sectional view of a Package-On-Package (POP) secure module 10 in accordance with a first novel aspect.

FIG. 1 is a simplified cross-sectional diagram of a novel Package-On-Package (POP) secure module 10. POP secure module 10 includes a first Ball Grid Array (BGA) package portion 11, and a second BGA package portion 12. First BGA package portion 11 includes a substrate member 13, an integrated circuit die 14, an array of bond balls, an array of lands, and discrete components 15 and 16. Six of the bond balls 17-22 are illustrated in the cross-sectional view. Integrated circuit die 14 is connected by wire bonds to substrate member 13 and is encapsulated with a block of encapsulant 23 such as epoxy potting encapsulant. Two of the bond wires 24 and 25, and four of the lands 26-29 are illustrated in the cross-sectional view.

Second BGA package portion 12 includes a substrate member 30, an integrated circuit die 31, and an array of bond balls. Four of the bond balls 32-35 are illustrated in the cross-sectional view. Integrated circuit die 31 is connected by wire bonds to substrate member 30 and is encapsulated with block of encapsulant 36. Two of the bond wires 37 and 38 are illustrated in the cross-sectional view. The bond balls 32-35 of second BGA package portion 12 register with and are fixed to corresponding ones of the lands 26-29 on the upper surface of the substrate member 13 of the first BGA package portion 11. The second BGA package portion 12 is therefore piggy-back mounted to the first BGA package portion 11 so that the two BGA package portions together form a secure module.

In the illustrated example, the substrate members 13 and 30 are multiple layer printed circuit boards of the type customarily used in the manufacture of BGA packages. Substrate member 30 of the second BGA package portion 12 includes a first anti-tamper security mesh 39 of conductors. The conductors of mesh 39 are approximately 0.2 millimeters wide and are spaced at approximately 0.2 millimeters from one another. As is described in further detail below, the mesh is powered and monitored by tamper control logic (see reference numeral 116 in FIG. 7) on integrated circuit die 14. The tamper control logic on integrated circuit die 14 is connected to conductors in mesh 39 via bond balls of the second BGA package portion that are not located on the periphery of substrate member 30. In the illustration of FIG. 1, the tamper control logic is coupled to a first conductor (WIRE0) of mesh 39 via a first terminal 40, bond wire 24, bond pad 41, laterally extending conductor 42, conductive via 43, land 27, bond ball 33, and conductive via 44. The tamper control logic is also coupled to a second conductor (WIRE1) of mesh 39 via a second terminal 45, bond wire 25, bond pad 46, laterally extending conductor 47, via 48, land 28, bond ball 34, and conductive via 49.

In addition, when POP secure module 10 is disposed on a printed circuit board within a point of sale (POS) terminal, the tamper control logic on integrated circuit die 14 also is coupled to, powers and monitors a second anti-tamper security mesh 50 (see FIGS. 5 and 6) located in the printed circuit board upon which the module 10 is mounted. The tamper control logic on integrated circuit die 14 is connected to the two conductors (WIRE3 and WIRE4) of second mesh 50 via bond balls of the first BGA package portion 11. These bond balls are not located at the periphery of substrate member 13 but rather are located toward the inside of first BGA package portion 11. The connections from integrated circuit die 14 to this second mesh are not seen in the simplified cross-section of FIG. 1, but the tamper control logic is coupled to a first conductor (WIRE3) of the second mesh 50 via a third terminal, a bond wire, an inner bond ball such as bond ball 19, and a surface mount pad on the printed circuit board and a conductive via that extends down into the printed circuit board to the first conductor in second mesh 50. Similarly, the tamper control logic is coupled to a second conductor (WIRE3) of the second mesh via a fourth terminal, a bond wire, an inner bond ball such as bond ball 20, and a surface mount pad on the printed circuit board and a conductive via that extends down into the printed circuit board to the second conductor in second mesh 50.

Figure 2:
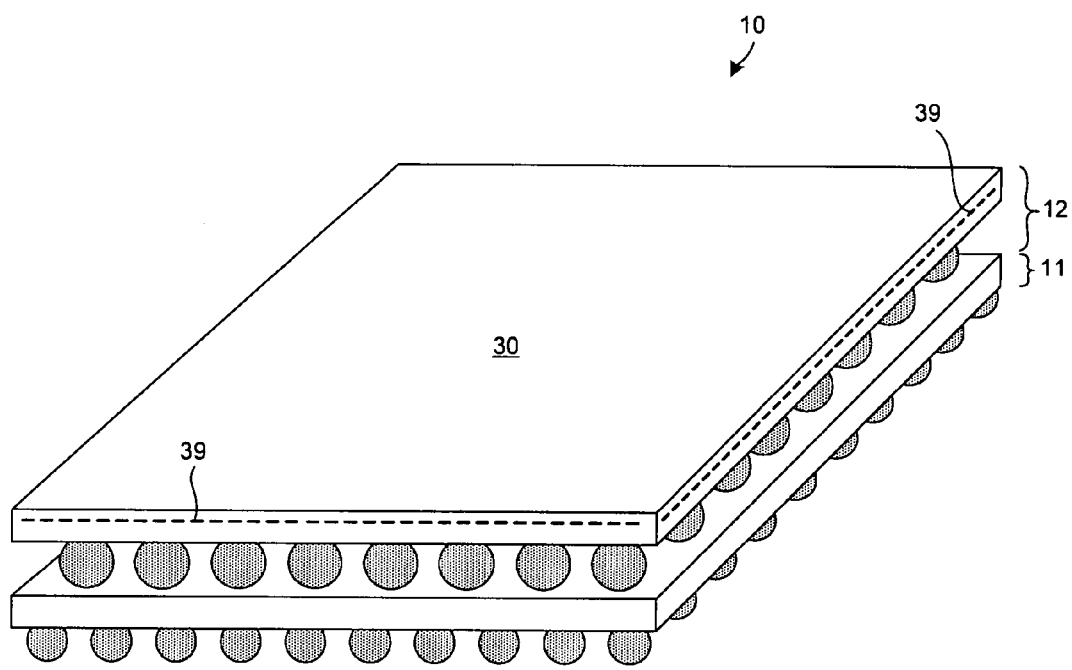
FIG. 2 is a perspective view of the POP secure module 10 of FIG. 1.

FIG. 2 is a perspective view of the POP security module 10 of FIG. 1. The dashed lines labeled with numeral 39 are not visible from the outside of module 10, but rather illustrate the plane in which the mesh 39 is disposed within substrate member 30.

Figure 3:
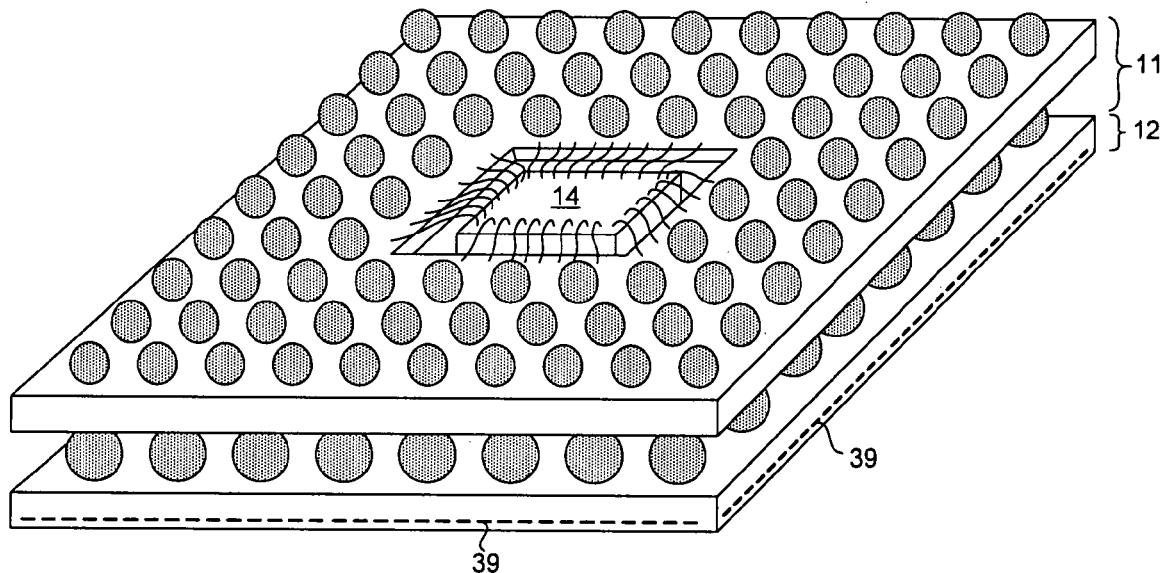
FIG. 3 is a perspective view of the bottom of the POP secure module 10 of FIG. 1 with the encapsulant removed to expose integrated circuit 14.

FIG. 3 is a perspective view of the bottom of module 10 with encapsulant 23 removed to show integrated circuit die 14 and its bond wires.

Figure 4:
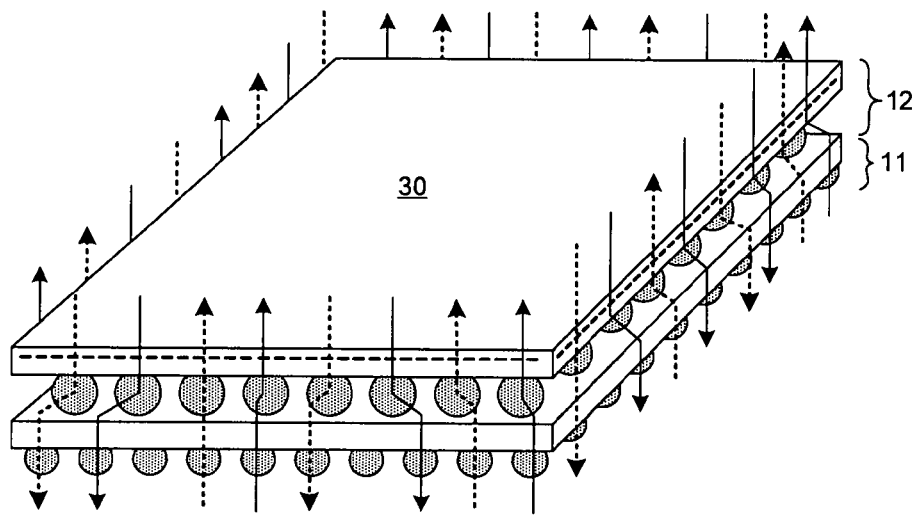
FIG. 4 is a perspective view that illustrates the picket fence extension of the first anti-tamper security mesh.

FIG. 4 illustrates the form of the peripheral portion of mesh 39. Mesh 39, rather than just existing in a laterally extending plane within substrate member 30, is also made to cup down around the side edges of POP secure module 10. In one example, the two conductors of mesh 39 are made to meander vertically up and down through the bond balls of the first and second BGA package portions 11 and 12 so as to form a picket fence like security structure that surrounds the integrated circuit dice 14 and 31 in the lateral dimension. A "picket" here involves a connection from a bond ball of the second BGA package portion 12, through a land on the upper surface of first BGA package portion 11, then down through substrate member 13, and through a bond ball of first BGA package portion 11 such that the two bond balls and the connection between them form a substantially vertical conductive path. In FIG. 4, the arrows drawn with the solid line represent pickets that are parts of the first conductor of mesh 39. The arrows drawn with the dashed line represent pickets that are parts of the second conductor of mesh 39. The picket fence like security structure helps protect against probing of the module from the sides.

In the present example, integrated circuit die 14 is a microcontroller-based integrated circuit that includes tamper control circuitry 116, a specialized boot loader mechanism, a secure memory 123, a processor 122, and other specialized circuitry for a point of sale terminal application. For additional details on integrated circuit 14 see: U.S. patent application Ser. No. 10/918,272, entitled "Secure Transaction Microcontroller With Secure Boot Loader", filed Aug. 13, 2004, by Hsiang et al., now U.S. Pat. No. 7,343,496 (the subject matter of which is incorporated herein by reference). The backside of integrated circuit die 14 is thinned by mechanical grinding so that die 14 is approximately six to eight mils thick. The bond balls of the first BGA package portion 11 are approximately eighteen mils in diameter. The bond balls of the second BGA package portion 12 are approximately twenty one mils in diameter.

In one example, integrated circuit 31 is a mass produced SDRAM die that is manufactured by an entity other than the entity that sells integrated circuit die 14. The maker of the SDRAM makes and sells discrete memory integrated circuits, whereas the maker of integrated circuit die 14 does not. The SDRAM component sees many uses other than use in a POS terminal and consequently it is produced in much higher volumes than is the relatively specialized integrated circuit die 14. SDRAM 31 is provided in secure module 10 rather than providing additional memory on integrated circuit die 14 and making die 14 larger in order to take advantage of the relatively low cost of providing the memory in the form of a mass produced integrated circuit.

Figure 5:
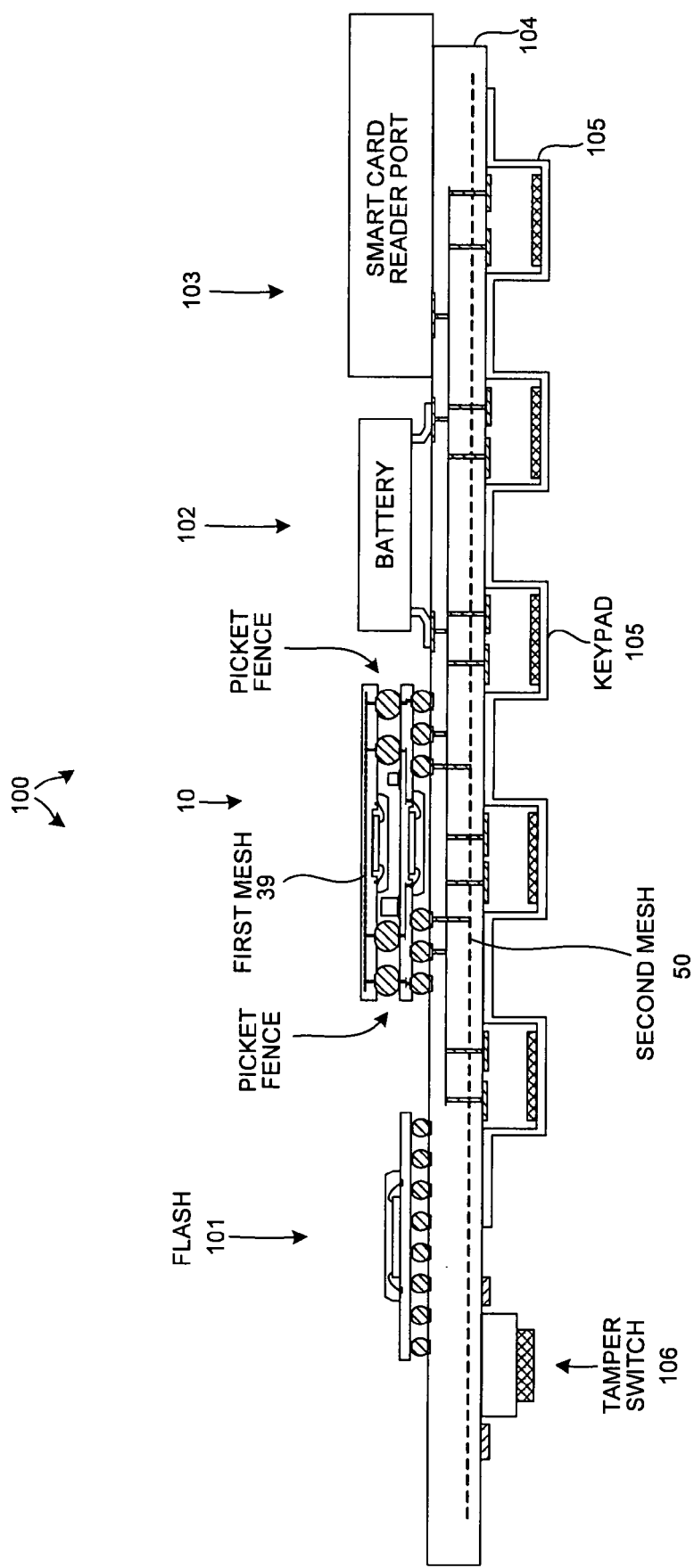
FIG. 5 is a simplified cross-sectional diagram showing the POP secure module 10 of FIG. 1 in use in a point of sale (POS) terminal.

FIG. 5 is a cross-sectional diagram of a portion of a point of sale (POS) terminal 100 that includes POP secure module 10. The plastic enclosure of POS terminal 100 is not illustrated. POP secure module 10, a FLASH memory device 101, a battery 102, and a smart card reader port 103 are surface mounted to a first side of a printed circuit board 104. A flexible keypad 105 and a tamper detect switch 106 are disposed a second side of the printed circuit board 104 opposite module 10. Each of the keys of keypad 105 has a conductive portion. When the key is pressed, the conductive portion of the key makes contact with and couples together an associated pair of interdigitated contact pads on printed circuit board 104. Integrated circuit die 14 includes key scanning circuitry for detecting which key is pressed.

As illustrated in FIG. 5, the second anti-tamper security mesh 50 is disposed in a metal trace layer within printed circuit board 104. In the specific example of FIG. 5, printed circuit board 104 has four metal trace layers. The interdigitated contact pads for the keypad are parts of the bottom metal layer. Second anti-tamper security mesh 50 is located in the next bottom most metal layer so that it is close to keypad 105. Providing mesh 50 close to keypad 105 helps prevent a hacker from gaining access to the backside of the keypad and monitoring key presses.

Figure 6:
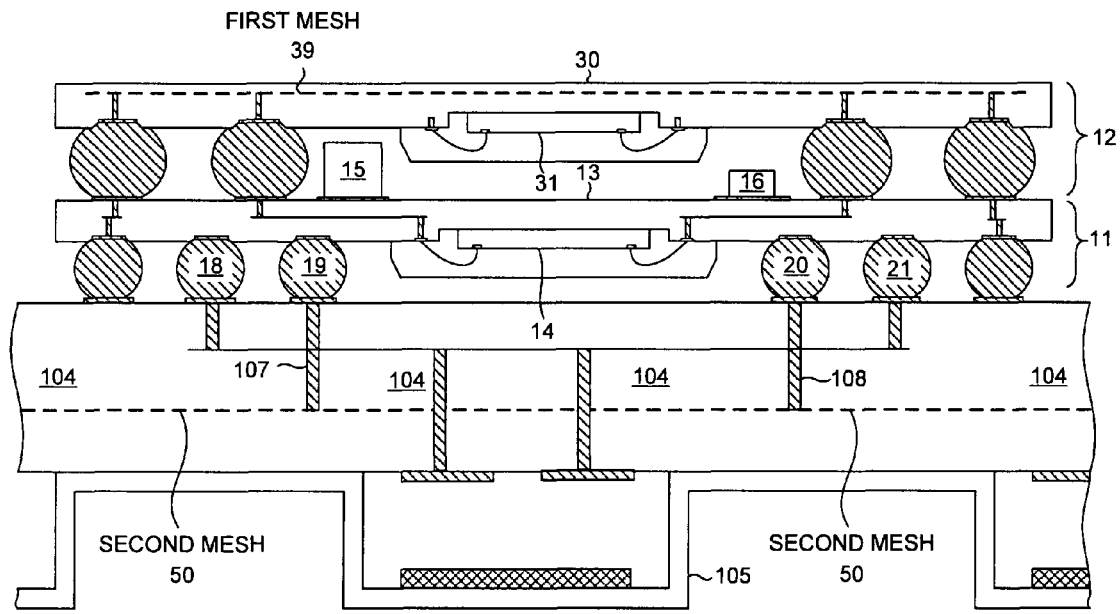
FIG. 6 is an expanded view of a part of FIG. 5.

FIG. 6 shows POS security module 10 and second mesh 50 of FIG. 5 in further detail. Mesh 50 is driven and is sensed by integrated circuit die 14. A third terminal 124 (not shown in FIG. 6, see FIG. 7) of integrated circuit die 14 is coupled by a bond wire (not shown) and conductors (not shown) in substrate member 13 to bond ball 19. Bond ball 19 is in turn connected by a surface mount pad and a vertically extending conductive via 107 to the first conductor in second anti-tamper mesh 50. A fourth terminal 125 (not shown in FIG. 6, see FIG. 7) of integrated circuit die 14 is coupled by a bond wire (not shown) and conductors (not shown) in substrate member 13 to bond ball 20. Bond ball 20 is in turn connected by a surface mount pad and a vertically extending conductive via 108 to the second conductor in second anti-tamper mesh 50.

Figure 7:
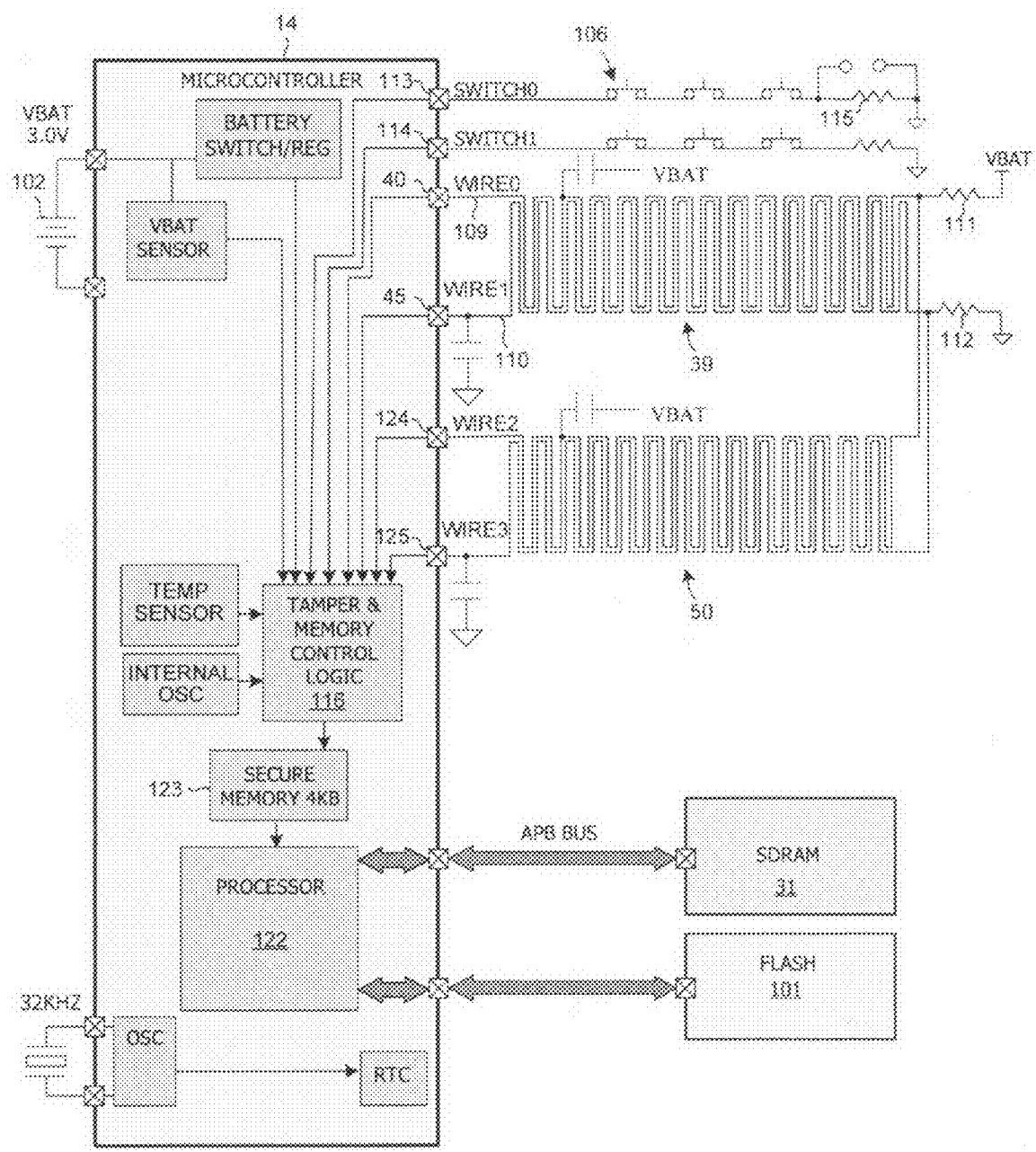
FIG. 7 is a circuit diagram that shows how integrated circuit 14 is connected to the first and second anti-tamper security meshes 39 and 50.

FIG. 7 is a simplified circuit diagram that shows how integrated circuit die 14 is coupled to the first and second meshes 39 and 50. First terminal 40 and second terminal 45 are the terminals illustrated in FIG. 1 that are coupled to the first and second conductors 109 and 110 of the first anti-tamper security mesh 39, respectively. Although mesh 39 is illustrated in FIG. 7 as having a regular serpentine path, the actual paths of conductors 109 and 110 of mesh 39 extend across the plane illustrated with the dashed line in FIG. 1 as well through the picket fence structure illustrated in FIG. 4. Each conductor of mesh 39 is terminated with a termination resistor. First conductor 109 (WIRE0) is terminated by resistor 111 whereas second conductor 110 (WIRE1) is terminated by resistor 112. Termination resistors 111 and 112 are discrete components and are mounted to surface mount pads on the upper surface of substrate member 13. Discrete component 16 of FIG. 1 is resistor 111. Resistor 112 is not seen in the particular cross-section of FIG. 1. Discrete component 15 is a bypass capacitor. There are two bond balls used to connect to each of the two conductors of mesh 39, one for connecting a first end of the conductor to the tamper terminal of the integrated circuit, and a second for connecting the second end of the conductor to its corresponding discrete termination resistor.

The terminals 113 and 114 labeled SWITCH0 and SWITCH1 in FIG. 7 are terminals that detect an opening of a tamper switch. Switch 106 of FIG. 5 is an example of a tamper switch. Tamper switches are positioned at various places in the POS terminal such that opening the POS terminal enclosure will cause one of more of these switches to open. For example, the top and bottom portions of the plastic enclosure of the POS terminal together may hold one of these switches in the closed position. If the enclosure is opened, then the top and bottom portions will separate and will no longer hold switch 106 in the closed position. When switch 106 opens, the voltage on terminal 113 will no longer be pulled to ground potential by resistor 115, but rather the voltage on terminal 113 will be pulled high by a resistor internal to integrated circuit die 14. This high voltage is detected by tamper control logic 116 as a tamper condition.

Figure 8:
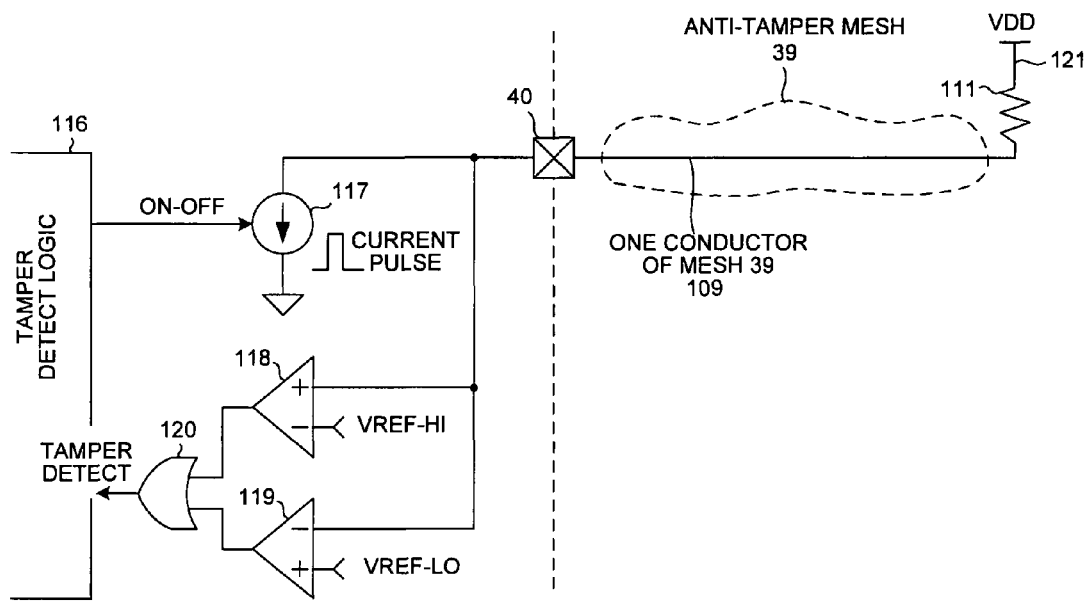
FIG. 8 is a simplified circuit diagram that illustrates how integrated circuit 14 drives and monitors a conductor of a security mesh.

FIG. 8 is a simplified circuit diagram of circuitry that illustrates how the conductor of the first and second meshes are driven and monitored. Initially, current source 117 is disabled by tamper detect logic 116. Termination resistor 111 therefore maintains the voltage on terminal 40 at supply potential VDD. The comparators 118 and 119 and OR gate 120 together output a TAMPER_DETECT signal if the voltage on terminal 40 is either above a high reference voltage VREF-HI or is below a low reference voltage VREF-LO. Only if the voltage on terminal 40 is between the two reference voltages is the TAMPER_DETECT signal not asserted. Accordingly, when the current source 117 is disabled, the voltage on terminal 40 is above VREF-HI and the TAMPER_DETECT signal is asserted. The tamper detect logic 116 within integrated circuit die 14 checks to confirm that TAMPER_DETECT is asserted.

Next, the tamper detect logic 116 causes current source 117 to sink a ten microampere pulse of current. If conductor 109 is intact and if conductor 109 is not touching conductor 110, then the current flow through resistor 111 will be such that the voltage on terminal 40 will be below the high reference voltage VREF-HI and also will be above the low reference voltage VREF-LO. The resistance from terminal 40 to supply voltage VDD node 121 is nominally 50 k ohms (will be greater than 20 k ohms and less than 80 k ohms). Accordingly, if there is no tamper condition, then the signal TAMPER-DETECT should not be asserted. Tamper detect logic 116 checks to confirm that TAMPER_DETECT is not asserted. Tamper detect logic 116 periodically checks each of the conductors of each of the anti-tamper meshes in this way, checking with the current sources disabled and then with the current sources enabled, to confirm that there has been no tamper condition.

In the presently described example of FIG. 5, an application program is stored in FLASH memory 101. Encryption keys usable for communicating with a financial institution are stored in secure read only memory (ROM) within integrated circuit die 14. On power up, a secure boot loader mechanism within integrated circuit die 14 reads the application program from FLASH memory 101. The application program includes a header portion that includes an identification word. A processor 122 within integrated circuit die 14 checks the identification word in an attempt to validate the application program. If the application program is validated, then processor 122 executes the application program out of SDRAM. Integrated circuit die 31 is the SDRAM. During operation of POS terminal 100, the encryption keys that are stored in secure memory 123 in integrated circuit die 14 may be used by software and therefore may temporarily be present in SDRAM 31. Accordingly, upon detection of a tamper condition, integrated circuit die 14 causes SDRAM 31 to be erased and also erases temporary unsecured registers within die 14 that a thief may be able to read after accessing the dice 14 and 31. POS terminal 100 is of such a design that the encryption keys cannot be read out of die 14 following a tamper detect condition. See U.S. patent application Ser. No. 10/918,272, now U.S. Pat. No. 7,343,496 for further details.

Figure 9:
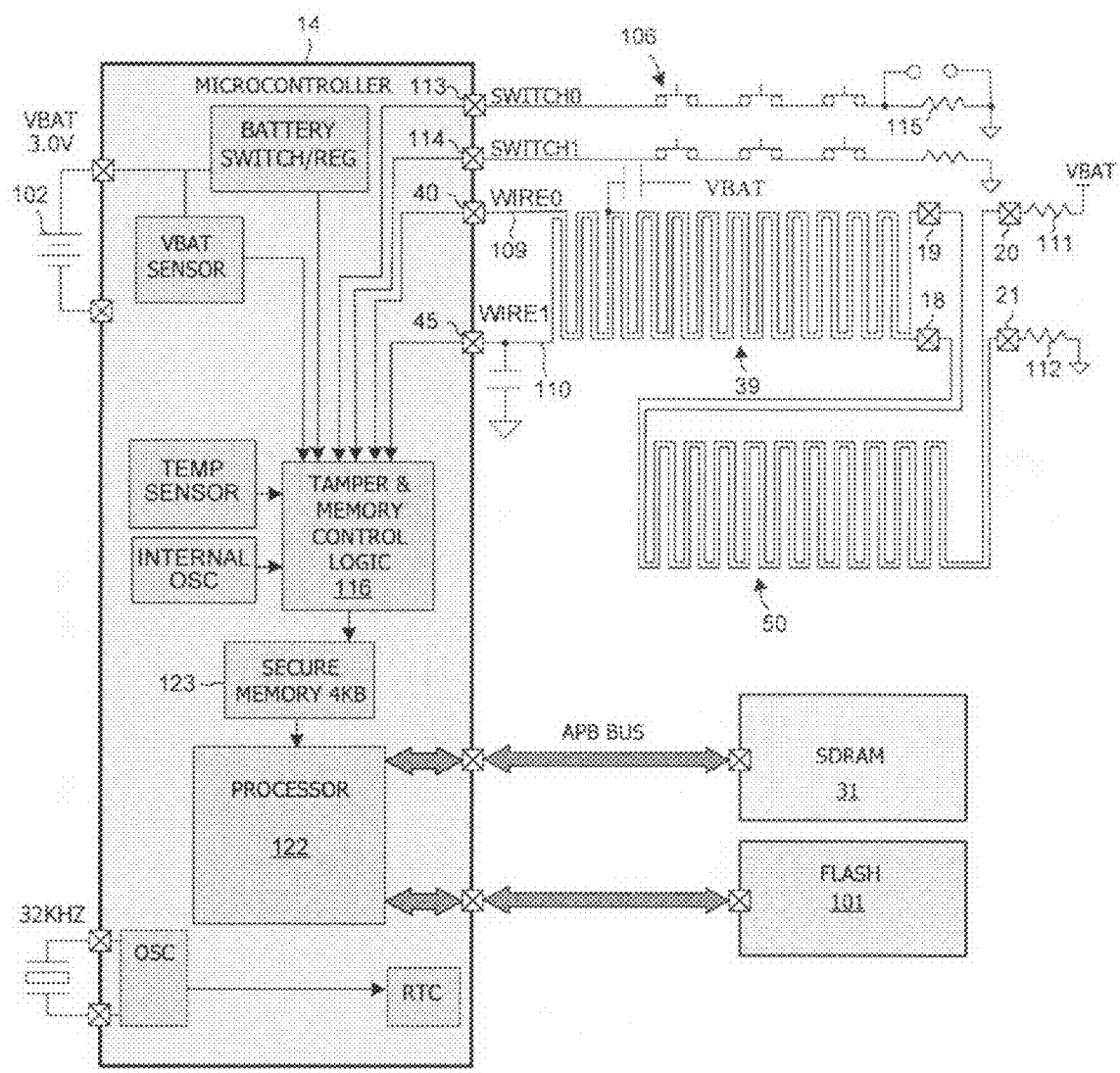
FIG. 9 is a simplified circuit diagram that shows another way that integrated circuit 14 can drive and monitor first and second anti-tamper security meshes 39 and 50.

FIG. 9 is a simplified circuit diagram that shows another way that the first and second meshes 39 and 50 can be connected to integrated circuit die 14. In this example, first mesh 39 extends laterally through the substrate member of the second BGA package portion 12 and second mesh 50 extends laterally through printed circuit board 104. Meshes 39 and 50 are, however, driven and monitored from only two terminals of integrated circuit 14. First conductor 109 (WIRE0) extends from terminal 40, through a bond wire, then up through the substrate member of the second BGA package portion, laterally through the substrate member, then back down through a bond ball of the second BGA package portion and to bond ball 19 of the first BGA package portion. From bond ball 19, the conductor continues down into the printed circuit board 104 upon which the secure module 10 is disposed. The conductor extends laterally through the mesh layer of the printed circuit board as a part of second mesh 50, and then extends back up to another bond ball 20 of the first BGA package portion. Band ball 20 is connected through the first BGA package portion to discrete resistor 111. The second conductor 110 (WIRE1) is connected in similar fashion. The second conductor 110 extends from integrated circuit terminal 45, through another bond wire, then up through the substrate member of the second BGA package portion, laterally through the substrate member, then back down through a bond ball of the second BGA package portion and to bond ball 18 of the first BGA package portion. From bond ball 18, the conductor continues down into the printed circuit board 104 upon which the secure module 10 is disposed. The conductor extends laterally through the mesh layer of the printed circuit board as a part of second mesh 50, and then extends back up to another bond ball 21 of the first BGA package portion. Band ball 21 is connected through the first BGA package portion to discrete resistor 112. The first mesh 39 and the second mesh 50 are therefore not driven and monitored separately from one another, but actually form a single larger anti-tamper mesh structure that extends both over and underneath the integrated circuits within the secure module 10. If the secure module 10 is to be used in a configuration without second mesh 50, then bond ball 19 can be coupled directly to bond ball 20 by a short trace on printed circuit board 104 or alternatively by a connection on secure module 10 itself. In the same way, bond ball 18 would be coupled directly to bond ball 21.

FIG. 10 is a cross-sectional diagram of a secure module 200 in accordance with a second novel aspect. Secure module 200 is a cavity-down BGA package. The first and second integrated circuits 14 and 31 of the embodiment of FIGS. 1-6 are disposed side by side in this cavity. Secure module 200 includes integrated circuit dice 14 and 31, a substrate member 201, and an array of bond balls. Six bond balls 202-207 are illustrated in the cross-sectional diagram of FIG. 7. Substrate member 201 includes an anti-tamper security mesh 208 that is embedded in substrate member 201. In one example, anti-tamper security mesh 208 also extends through bond balls of the periphery of module 200 to form a picket fence security mesh structure. Integrated circuit die 14 drives mesh 208 and monitors mesh 208 for a tamper detect condition. Each of the two conductors of mesh 208 is terminated by a discrete resistor that is surface mounted to substrate member 201 in the cavity along with the integrated circuit dice 14 and 31. Discrete component 209 is one of these resistors. Discrete component 210 is a bypass capacitor. The circuit operation of FIG. 9 is the same as the circuit operation described above of the embodiment of FIGS. 1-8.

In addition, when secure module 200 is disposed in a POS terminal, integrated circuit die 14 is surface mounted to a printed circuit board as explained in connection with FIG. 12. Integrated circuit die 14 is coupled through inner bonds balls 204 and 205 and conductive vias 211 and 212 to second mesh 50 in the underlying printed circuit board. Integrated circuit die 14 drives and monitors anti-tamper mesh 50 as described in connection with the embodiment of FIGS. 1-8. There are two bond balls used to connect to each of the two conductors of second mesh 50, one for connecting a first end of the conductor to the tamper terminal of the integrated circuit, and a second for connecting the second end of the conductor to the discrete termination resistor.

FIG. 11 is a perspective view of module 200 of FIG. 10. The dashed line illustrates the plane of the first mesh 208.

Figure 12:
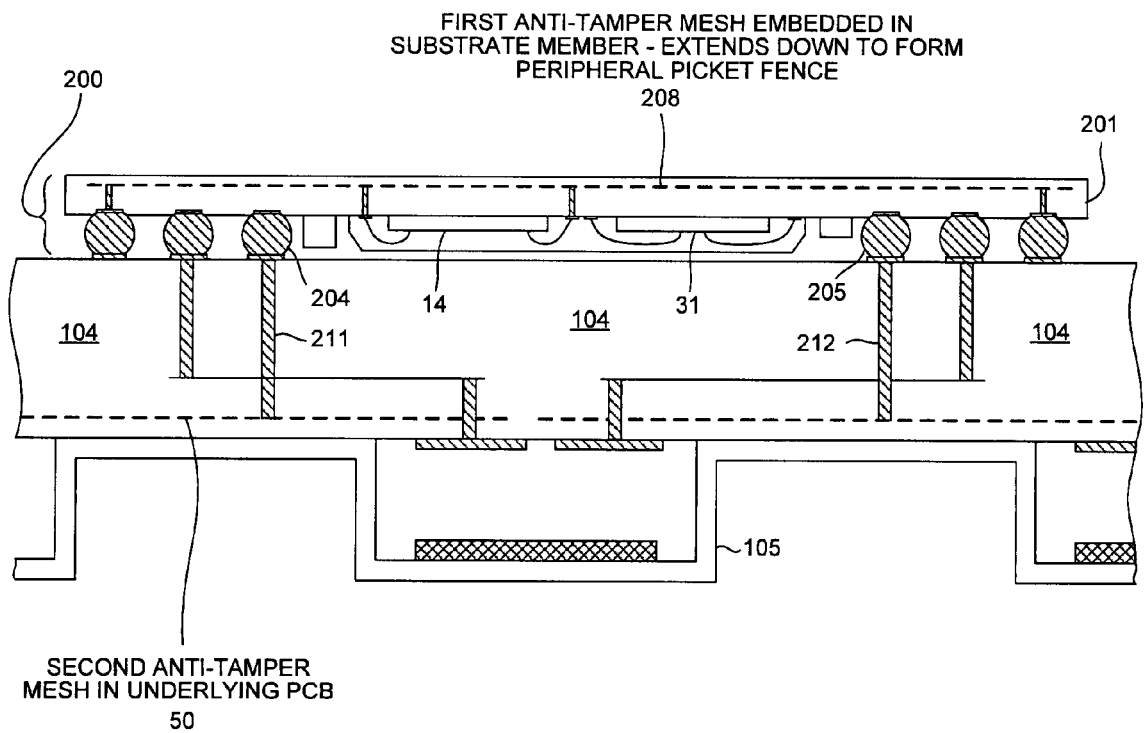

FIG. 12 is a simplified cross-sectional diagram that shows how integrated circuit die 14 is coupled to the two conductors of the second mesh 50.

Although certain specific embodiments are described above for instructional purposes, the teachings of this patent document have general applicability and are not limited to the specific embodiments described above. The substrate members of the first and second BGA package portions can be multi-layer ceramic structures. The substrate members can be flexible circuit boards made using a polyimide or polyester or other flexible base material. Surface mount attachment structures other than bond balls can be used on the first and second BGA package portions. The first wire mesh or part of the first wire mesh can be made from strips of conductive encapsulant material within a layer of nonconductive encapsulant material. The conductive encapsulant may, for example, be an ordinarily nonconductive epoxy resin material that is made conductive due to a dispersed conductive metal powder. The integrated circuit having the tamper control logic that drives and monitors the first mesh 39 can be mounted into the second (upper) BGA package portion as opposed to the first (lower) BGA package portion. The discrete components including, for example, the termination resistors can be surface mounted to the second BGA package portion as opposed to, or in addition to, being attached to the first BGA package portion. An anti-tamper mesh can be made to extend through the substrate member of the first BGA package portion in addition to the first anti-tamper mesh 39 extending through the substrate member of the second BGA package portion. Either of the integrated circuits can be flip-chip mounted rather than being wire bonded to their respective substrate members. Either of the integrated circuits can be replaced with a pair of face-to-face die-bonded integrated circuits. Multiple integrated circuits can be disposed side by side in the cavities of the first and second BGA package portions. The single picket fence mesh structure can be expanded to involve a staggered picket fence structure involving more than one peripheral ring of bond balls. Accordingly, various modifications, adaptations, and combinations of various features of the described embodiments can be practiced without departing from the scope of the invention as set forth in the claims.

What is claimed is:

1. An assembly comprising:
   a first ball grid array (BGA) package having a substrate member, an integrated circuit die and an array of bond balls, wherein the bond balls are disposed on a first side of the substrate member, and wherein the substrate member includes an array of lands that are disposed on a second side of the substrate member opposite the first side; and
   a second BGA package having a substrate member, an integrated circuit die and an array of bond balls, wherein the bond balls of the second BGA package are fixed to the lands of the substrate member of the first BGA package, wherein the substrate member comprises a first anti-tamper security mesh of conductors, and wherein a conductor of the first anti-tamper security mesh is coupled to the integrated circuit die of the first BGA package through a bond ball of the second BGA package.

2. The assembly of claim 1, wherein the substrate member of the second BGA package is a printed circuit board comprising multiple conductive layers, and wherein the first anti-tamper security mesh involves conductors in one of the multiple conductive layers.

3. The assembly of claim 1, wherein the substrate member of the first BGA package is a printed circuit board comprising multiple conductive layers, and wherein the printed circuit board of the first BGA package includes a second anti-tamper security mesh.

4. The assembly of claim 3, further comprising:
a keypad having a plurality of keys, wherein the keypad is disposed on a side of the printed circuit board opposite the first and second BGA packages, and wherein the anti-tamper security mesh layer of the printed circuit board is disposed between the keypad and the first and second BGA packages.

5. The assembly of claim 1, further comprising:
a printed circuit board having a plurality of surface mount pads, wherein the bond balls of the first BGA package are fixed to the surface mount pads on a first side of the printed circuit board so that the first BGA package is fixed to the first side of the printed circuit board, wherein the printed circuit board includes a second anti-tamper security mesh layer, and wherein a conductor of the second anti-tamper security mesh layer is coupled to one of the bond balls of the first BGA package.

6. The assembly of claim 5, further comprising:
a surface mount component that is fixed to the first side of the printed circuit board.

7. The assembly of claim 5, wherein the assembly is a point of sale terminal.

8. The assembly of claim 5, wherein a conductive path extends laterally from integrated circuit die of the first BGA package through a substrate member of the first BGA package, vertically up through a first bond ball of the second BGA package, laterally through the first anti-tamper security mesh of the second BGA package over the integrated circuit die of the first BGA package to a second bond ball of the second BGA package, vertically down through the second bond ball and through the substrate member of the first BGA package to a discrete resistor, wherein the discrete resistor is surface mounted to the substrate member of the first BGA package.

9. The assembly of claim 5, wherein a conductive path extends laterally from integrated circuit die of the first BGA package through a substrate member of the first BGA package, vertically up through a first bond ball of the second BGA package, laterally through the first anti-tamper security mesh of the second BGA package over the integrated circuit die of the first BGA package to a second bond ball of the second BGA package, vertically down through the second bond ball and through the substrate member of the first BGA package to a discrete resistor, wherein the discrete resistor is surface mounted to the substrate member of the second BGA package.

10. The assembly of claim 1, wherein the first anti-tamper security mesh comprises at least one pair of electrically isolated conductors, wherein a first of the conductors of the pair is coupled to a first terminal of the integrated circuit die of the first BGA package through a first bond ball of the second BGA package, and wherein a second of the conductors of the pair is coupled to a second terminal of the integrated circuit die of the first BGA package through a second bond ball of the second BGA package.

11. The assembly of claim 1, wherein pairs of bond balls form an anti-tamper picket fence structure that encircles the integrated circuit die of the first BGA package, wherein each pair includes a bond ball of the first BGA package and a bond ball of the second BGA package, and wherein the bond balls of each pair are electrically connected together to form a substantially vertical picket of the picket fence structure.

12. The assembly of claim 1, wherein the bond ball of the second BGA package through which the conductor of the first anti-tamper security mesh is coupled to the integrated circuit die of the first BGA package is not located on the periphery of the substrate member of the second BGA package.

13. The assembly of claim 1, wherein a current source is coupled to the conductor of the first anti-tamper security mesh and is used to detect a tamper condition.

14. The assembly of claim 1, wherein the conductor of the first anti-tamper security mesh is terminated with a termination resistor.

15. An assembly comprising:
a first ball grid array (BGA) package having a substrate member and an array of bond balls, wherein the bond balls are disposed on a first side of the substrate member, and wherein the substrate member includes an array of lands that are disposed on a second side of the substrate member opposite the first side;
a second BGA package having a substrate member and an array of bond balls, wherein the bond balls of the second BGA package are fixed to the lands of the substrate member of the first BGA package, and wherein the substrate member comprises a first anti-tamper security mesh of conductors; and
a printed circuit board having a plurality of surface mount pads, wherein the bond balls of the first BGA package are fixed to the surface mount pads on a first side of the printed circuit board so that the first BGA package is fixed to the first side of the printed circuit board, wherein the printed circuit board includes a second anti-tamper security mesh layer, and wherein a conductor of the second anti-tamper security mesh layer is coupled to a conductor of the second anti-tamper security mesh through one of the bond balls of the first BGA package.

16. The assembly of claim 15, wherein the second BGA package has an integrated circuit die, and wherein the conductor of the anti-tamper security mesh layer is coupled to the integrated circuit die of the second BGA package through one of the bond balls of the first BGA package.

17. The assembly of claim 15, wherein the conductor of the anti-tamper security mesh is terminated with a termination resistor.

* * * * *